United States Patent
Lagorgette et al.

(10) Patent No.: US 10,310,452 B2
(45) Date of Patent: Jun. 4, 2019

(54) TIMEPIECE COMPRISING A WHEEL SET WITH A DETERMINABLE ANGULAR POSITION

(71) Applicant: ETA SA Manufacture Horlogere Suisse, Grenchen (CH)

(72) Inventors: Pascal Lagorgette, Bienne (CH); Matthieu Tardivon, Renens (CH); Rene Rufener, Bienne (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 0 days.

(21) Appl. No.: 15/389,861

(22) Filed: Dec. 23, 2016

(65) Prior Publication Data
US 2017/0185045 A1   Jun. 29, 2017

(30) Foreign Application Priority Data
Dec. 23, 2015 (EP) .................................. 15202349

(51) Int. Cl.
*G04C 3/00* (2006.01)
*G04C 3/14* (2006.01)
(Continued)

(52) U.S. Cl.
CPC ............. *G04C 3/14* (2013.01); *G01D 5/2412* (2013.01); *G04C 3/002* (2013.01); *G04C 3/146* (2013.01);
(Continued)

(58) Field of Classification Search
CPC ... G04C 3/14; G04C 9/00; G04C 9/04; G01R 27/26
See application file for complete search history.

(56) References Cited

U.S. PATENT DOCUMENTS

| | | | | |
|---|---|---|---|---|
| 4,182,111 A | * | 1/1980 | Tamaru | G04C 3/005 368/52 |
| 5,077,635 A | * | 12/1991 | Bollhagen | G01D 5/2412 318/662 |

(Continued)

FOREIGN PATENT DOCUMENTS

| | | |
|---|---|---|
| JP | 2004-163128 | 6/2004 |
| JP | 2004-233132 | 8/2004 |

OTHER PUBLICATIONS

European Search Report dated May 3, 2016 in European Application 15202349, filed on Dec. 23, 2015 ( with English Translation of Categories of Cited Documents and Written Opinion).

(Continued)

*Primary Examiner* — Daniel P Wicklund
(74) *Attorney, Agent, or Firm* — Oblon, McClelland, Maier & Neustadt, L.L.P.

(57) ABSTRACT

A timepiece includes a timepiece movement provided with an analog display and at least one wheel rotating integrally with a rotary indicator of the analog display. The wheel includes an electrically conductive plate pierced with at least one aperture. The timepiece also includes a device for detection of a reference angular position of the aperture. The detection device includes a first electrode, a second electrode, and a common electrode which are planar and arranged in a plane parallel to the wheel. The common electrode is arranged along portions of the first electrode and of the second electrode. The aperture is at least partially above or below: the first electrode in a first position of disequilibrium; the first electrode and the second electrode in a position of equilibrium; and the second electrode in a second position of disequilibrium.

9 Claims, 3 Drawing Sheets

(51) Int. Cl.
   *G01D 5/241* (2006.01)
   *G01D 5/24* (2006.01)
   *G01R 27/26* (2006.01)

(52) U.S. Cl.
   CPC .............. *G01D 5/24* (2013.01); *G01D 5/241* (2013.01); *G01R 27/26* (2013.01)

(56) References Cited

U.S. PATENT DOCUMENTS

| | | | | |
|---|---|---|---|---|
| 5,479,380 | A * | 12/1995 | Miyazawa | G04C 3/12 368/157 |
| 5,598,153 | A * | 1/1997 | Brasseur | G01B 7/30 318/662 |
| 5,910,781 | A * | 6/1999 | Kawamoto | G01D 5/2405 318/662 |
| 6,218,803 | B1 * | 4/2001 | Montagu | G01D 5/2405 318/652 |
| 6,307,814 | B1 * | 10/2001 | Farine | G04C 3/14 368/187 |
| 6,949,937 | B2 * | 9/2005 | Knoedgen | G01D 5/241 324/658 |
| 8,902,717 | B1 * | 12/2014 | Garzon | G04B 13/00 368/220 |
| 2003/0030570 | A1 * | 2/2003 | Netzer | G01D 5/2415 340/870.37 |
| 2004/0081028 | A1 * | 4/2004 | Yiu | G04C 3/14 368/185 |
| 2005/0002277 | A1 * | 1/2005 | Fukuda | G01D 5/2412 368/80 |
| 2008/0018596 | A1 * | 1/2008 | Harley | G06F 3/0354 345/157 |
| 2015/0205094 | A1 * | 7/2015 | West | G02B 26/0816 359/862 |

OTHER PUBLICATIONS

Philippe Vez et al. "Systeme de detection et de synchronisation des aiguilles d'une montre", Actes du Congres Europeen de Chronmetrie Societe Suisse de Chronmetrie, 2007, 3 pages.

* cited by examiner

TIMEPIECE COMPRISING A WHEEL SET WITH A DETERMINABLE ANGULAR POSITION

This application claims priority from European Patent Application No 15202349.5 of Dec. 23, 2015, the entire disclosure of which is hereby incorporated herein by reference.

FIELD OF THE INVENTION

The invention relates to the technical field of timepieces including a timepiece movement provided with an analogue display and with at least one wheel rotating integrally with a rotary indicator of the analogue display.

BACKGROUND OF THE INVENTION

To determine the angular position of such a wheel, it is known from EP Patent 0952426 to provide the latter with a surface layer made of a particular material, and a with through aperture located in an intermediate area between the axis of rotation of the wheel and its circumference. A proximity sensor, which is static with respect to the wheel, is positioned directly above or below the aperture when the wheel is in a reference position. This sensor is capable of sensing the particular material and of providing a measurement signal dependent on variations in the proximity of said material. Thus, the measurement signal has a particular shape when the aperture passes above the sensor, for example a peak.

To determine an angular position in which the wheel is located, it is proposed to make the wheel complete one stepwise rotation by means of a stepping motor, while recording the measurement signal. The aforementioned peak thus indicates the passage of the wheel through its reference position. Once the reference position has been identified on the graph representing the measurement signal, it is easy to deduce therefrom the angular position of the wheel corresponding to another point on the graph, in particular, the initial angular position of the wheel, i.e. its position before it starts the rotation.

EP Patent 0952426 proposes to use an inductive sensor or a capacitive sensor, while specifying, however, that a capacitive sensor is more sensitive to the environment and to disturbances caused by manufacturing and assembly tolerances than an inductive sensor. A capacitive sensor is in particularly affected by endshake, in the direction of the axis of rotation of the wheel, between the wheel and the sensor. The greater this endshake, the broader the peak: the precision of detection of the angular reference position is thus directly affected by endshake.

SUMMARY OF THE INVENTION

It is an object of the present invention to overcome the aforecited drawback by proposing a solution for determining the angular position of a wheel by a capacitive sensor, whose precision is not affected by variations in endshake between the wheel and the sensor.

To this end, the invention relates to a timepiece including:
a timepiece movement provided with an analogue display and with at least one wheel rotating integrally with a rotary indicator of said analogue display, said wheel including an electrically conductive plate extending substantially orthogonally to the axis of rotation of the wheel, and pierced with at least one aperture,
a device for detection of a reference angular position of the aperture, the detection device including at least one set of planar electrodes comprising a first electrode, a second electrode, and a common electrode arranged in a plane parallel to the wheel, the common electrode being arranged along portions of the first electrode and of the second electrode,
the aperture being at least partially above or below:
the first electrode in a position called the first position of disequilibrium
the first and the second electrode in a position called the position of equilibrium
the second electrode in a position called the second position of disequilibrium.

The first electrode and the common electrode form a first electrical capacitor of capacitance $C1$, whereas the second electrode and the common electrode form a second electrical capacitor of capacitance $C2$. By utilising a stepping motor subjecting the wheel to one complete stepwise rotation, and a measurement circuit generating a measurement signal representing $$\frac{C1 - C2}{C1 + C2}$$

as a function of the number of steps, there is obtained a curve exhibiting a maximum and minimum. The maximum is observed when the aperture is in the first position of disequilibrium; the minimum is observed when the aperture is in the second position of disequilibrium; the curve has a value of zero when the aperture is in the position of equilibrium.

Given that the maximum and the minimum are characteristics of specific angular positions of the wheel, when the maximum and the minimum have been identified on the graph representing the measurement signal, it is possible to deduce the angular position of the wheel corresponding to another point on the graph. It is possible, in particular, to deduce therefrom the initial angular position of the wheel, i.e. its position before it starts the rotation, which is the position sought.

Utilising a differential capacitance measurement, rather than a single capacitance measurement as is the case in the prior art, allows the shape of the curve to made independent of the endshake between the wheel and the electrodes. Thus, even when the endshake is significant, the maximum and minimum can be precisely identified on the curve. Further, identifying two characteristic positions of the wheel on the curve, rather than a single position as is the case of the prior art, renders the determination of the angular position of the wheel more reliable.

It is noted, moreover, that a "planar electrode" means a conductive part extending significantly in at least two directions in one plane, as opposed to stick shaped electrodes.

Further, the wheel plate may include more than one aperture, and the detection device may include more than one set of electrodes of the aforecited type. In such case, each aperture is arranged to be opposite the first and the second electrode of a set in one specific position of the wheel.

Further, the timepiece may include one or more of the following features, in any technically possible combination.

In a non-limiting embodiment, all three of the electrodes have a substantially identical area. This configuration causes a significant disequilibrium between capacitance $C1$ and capacitance C2, and consequently a significant absolute value of the amplitude of the maximum and of the minimum of the curve. Further, it is noted that in some configurations of the electrodes, the curve exhibits a step between the peak corresponding to the maximum and the trough corresponding to the minimum. A step means a section of lower slope on either side of the section. The configuration that has just been described can minimise the length of this step.

In one non-limiting embodiment, the aperture is at least partially above or below the common electrode in the first position of disequilibrium, the position of equilibrium and the second position of disequilibrium. This configuration makes it possible to obtain a particularly pronounced peak and trough.

In one non-limiting embodiment, all three electrodes are above or below the aperture in the second position. The aperture in the wheel may then be smaller than all the electrodes. This configuration makes it possible to remove any step between the peak and the trough of the curve.

In a non-limiting embodiment, the common electrode includes two planar half electrodes electrically connected to each other, the half electrodes being arranged on either side of the assembly formed by the first and the second electrode.

In one non-limiting embodiment, the common electrode includes two planar half electrodes electrically connected to each other, the half electrodes being arranged between the first and the second electrode.

In one non-limiting embodiment, the first electrode and the second electrode are side-by-side, and the common electrode extends substantially in the shape of an annular portion along the first and the second electrode. This configuration makes it possible to use a first and a second electrode of significant surface area, for example a first and a second electrode whose total surface area is substantially that of the aperture. Significant surface areas of the first and the second electrode result in a significant absolute value of the amplitude of the maximum and minimum on the curve.

The invention also concerns a method for determination of an angular position of a wheel of a timepiece movement of a timepiece, as mentioned in the preceding paragraphs, including:
  a stepwise rotation of said wheel, for example by means of a stepping motor
  simultaneously with the rotation, a measurement of $$\frac{C1 - C2}{C1 + C2}$$

as a function of the rotational steps, where C1 is an electrical capacitance of a capacitor formed by the first electrode and the common electrode, and C2 is an electrical capacitance of a capacitor formed by the second electrode and the common electrode
  detection of a maximum and of a minimum on a curve representing the measurement
  determination of the angular position of the wheel, by means of the detected maximum and minimum.

BRIEF DESCRIPTION OF THE DRAWINGS

Other features and advantages will appear clearly from the following description, given by way of non-limiting illustration, with reference to the annexed drawings, in which:

FIG. 2b represents a measurement curve gradually achieved during the rotation of the wheel, in a state corresponding to the position of the wheel in FIG. 2a.

FIG. 3b represents the measurement curve in a state corresponding to the position of the wheel in FIG. 3a.

FIG. 4b represents the measurement curve in a state corresponding to the position of the wheel in FIG. 4a.

FIG. 5b represents the measurement curve in a state corresponding to the position of the wheel in FIG. 5a.

FIG. 6b represents the measurement curve in a state corresponding to the position of the wheel in FIG. 6a.

FIG. 7b represents the measurement curve in a state corresponding to the position of the wheel in FIG. 7a.

DETAILED DESCRIPTION OF PREFERRED EMBODIMENTS

The invention concerns a timepiece including a timepiece movement. The timepiece movement includes a wheel MB in the form of a disc, which also comprises an arbor defining a geometric axis of rotation. The timepiece movement is associated with an analogue display including a rotary indicator (RI) fixedly mounted on the arbor. The indicator (RI) may be used to indicate the hour, the minute, the second or any other information intended for an analogue display.

Wheel MB includes an electrically conductive plate PT, extending substantially orthogonally to the axis of rotation of wheel MB. Said plate PT is pierced with a through aperture OV in the form of an annular portion, placed in an intermediate area between its periphery and a central hole provided for the passage of the arbor. The through aperture OV extends, for example, over 120 degrees.

Opposite wheel MB, above or below wheel MB, is positioned a plate PA, for example in the form of a half disc. Plate PA extends substantially parallel to plate PL of wheel MB and orthogonally to the axis of rotation of wheel MB. Advantageously, plate PA is a printed circuit board (PCB) on which three planar electrodes are printed. Unlike the wheel, plate PA is stationary: the wheel is thus capable of rotating with respect to plate PA.

Plate PA includes a set of electrodes. The set of electrodes includes three planar electrodes, called first electrode E1, second electrode E2 and common electrode Em. The three electrodes E1, E2, Em take the form of annular portions. Common electrode Em is arranged along portions of first electrode E1 and of second electrode E2, so as to form, with first electrode E1, a first electrical capacitor of capacitance C1, and, with second electrode E2, a second electrical capacitor of capacitance C2. Due to the presence of aperture OV in plate PT, the value of capacitances C1, C2 depends on the angular position of wheel MB with respect to electrodes E1, E2, Em. In particular, capacitance C1, respectively C2, is maximum when aperture OV is above first electrode E1 and common electrode Em, respectively above second electrode E2 and common electrode Em, since the electrical charge transfer from one electrode to another is no longer facilitated by the presence of the electrically conductive material of plate PT.

Figure 1:
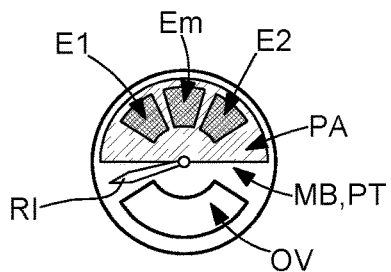
FIG. 1 represents a device for detection of an angular position of a rotary wheel of a timepiece movement of a timepiece, superposed above said wheel, in a first embodiment of the invention.

A first configuration of these electrodes E1, E2, Em on plate PA is represented in FIG. 1. In this configuration, the three electrodes E1, E2, Em have substantially identical surface areas, and common electrode Em is placed between first electrode E1 and second electrode E2. Further, the total surface area of electrodes E1, E2, Em is substantially on the order of the surface area of aperture OV. In the embodiment illustrated in FIG. 1, aperture OV extends over 120 degrees and each electrode extends over 120/3*0.98=38 degrees (these angular features are of course not limiting). There therefore exists an angular position of wheel MB with respect to plate PA (that shown in FIG. 4a) in which the three electrodes are completely opposite aperture OV, and aperture OV is completely opposite electrodes E1, E2, Em.

To determine an initial angular position of wheel MB, which is that of FIG. 1 in the non-limiting example presented below, it is proposed to cause wheel MB to make one complete stepwise rotation about its axis of rotation. This rotation is achieved by means of a stepping motor (not represented). The stepping motor is, for example, be a bipolar "Levet" type motor. Transmission from the motor to the wheel (not represented) is preferably formed by a reduction gear train. An electronic measuring circuit, for example comprising a microcontroller, is arranged for measuring the value of $$\frac{C1-C2}{C1+C2}$$

as a function of the number of steps imparted to wheel MB, and for generating a measurement curve CB.

Figure 2A:
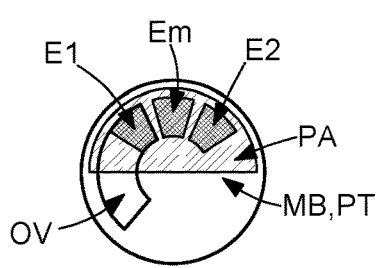
FIG. 2a represents the detection device of FIG. 1, and the rotary wheel in a first angular position occupied during one complete rotation of said wheel from the initial angular position.
Figure 3A:
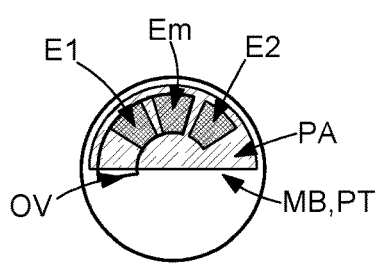
FIG. 3a represents the detection device of FIG. 1, and the rotary wheel in a second angular position, called the first position of disequilibrium, occupied during a complete rotation of said wheel from the initial angular position.
Figure 4A:
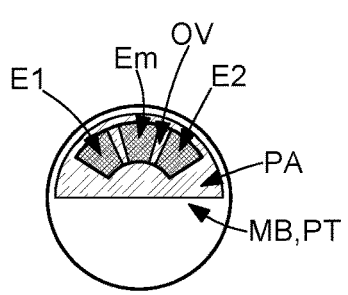
FIG. 4a represents the detection device of FIG. 1, and the rotary wheel in a third angular position, called the position of equilibrium, occupied during a complete rotation of said wheel from the initial angular position.
Figure 5A:
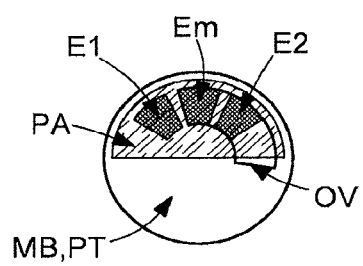
FIG. 5a represents the detection device of FIG. 1, and the rotary wheel in a fourth angular position, called the second position of equilibrium, occupied during a complete rotation of said wheel from the initial angular position.
Figure 6A:
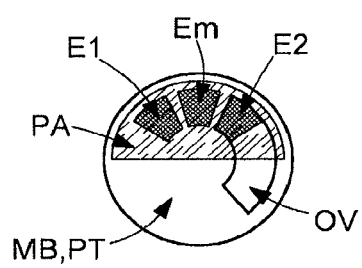
FIG. 6a represents the detection device of FIG. 1, and the rotary wheel in a fifth angular position occupied during a complete rotation of said wheel from the initial angular position.

FIGS. 2a, 3a, 4a, 5a, 6a and 7a represent successive angular positions of wheel MB with respect to plate PT during one complete rotation of said wheel MB starting from the position of FIG. 1. In the position of FIG. 2a, only first electrode E1 is opposite aperture OV of wheel MB. In the position of FIG. 3a, first electrode E1 and common electrode Em are located opposite aperture OV. In the position of FIG. 4a, the three electrodes E1, E2, Em are all three opposite the aperture. In the position of FIG. 5a, common electrode Em and a second electrode E2 are opposite the aperture. In the position of FIG. 6a, only second electrode E2 is opposite aperture OV. Finally, in the position of FIG. 7a, wheel MB is back in its initial position: none of the three electrodes E1, E2, Em is opposite aperture OV.

FIGS. 2b, 3b, 4b, 5b, 6b and 7b illustrate measurement curve CB representing $$\frac{C1-C2}{C1+C2}$$

as a function of a number of steps N imparted to wheel MB, at moments corresponding to the positions occupied by wheel MB in FIGS. 2a, 3a, 4a, 5a, 6a and 7a.

Figure 2B:
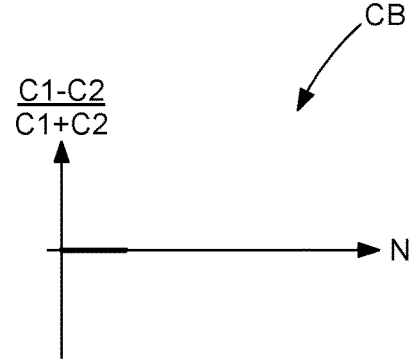
Figure 3B:
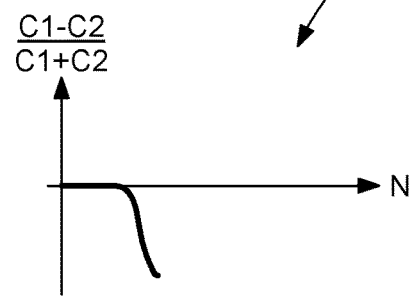

As represented in FIG. 2b, measurement curve CB has a zero value from the initial position of wheel MB to the position of FIG. 2a. Then, as represented in FIG. 3b, the value of $$\frac{C1-C2}{C1+C2}$$

diminishes between the position of FIG. 2a and the position of FIG. 3a. Curve CB achieves a minimum value when both, and only both, electrode E2 and common electrode Em are opposite aperture OV.

Figure 4B:
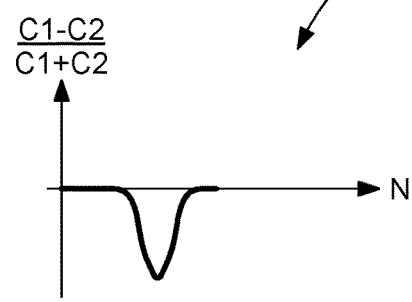
Figure 5B:
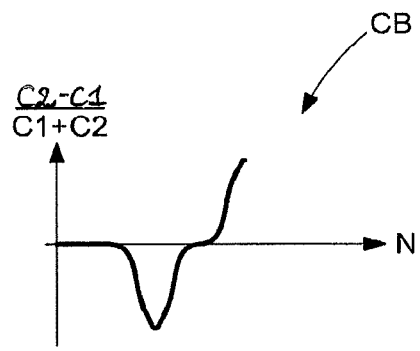

As represented in FIG. 4b, the values taken by curve CB increase until they return to a zero value between the position of FIG. 3a and the position of FIG. 4a. Then, as represented in FIG. 5b, the value of $$\frac{C1-C2}{C1+C2}$$

diminishes between the position of FIG. 4a and the position of FIG. 5a. Curve CB achieves a maximum value when both, and only both, electrode E2 and common electrode Em are opposite aperture OV.

Figure 6B:
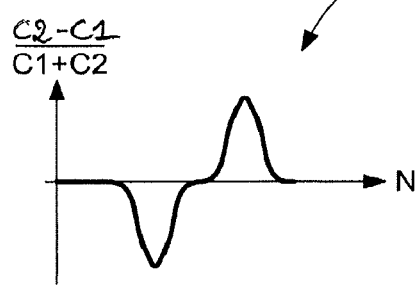
Figure 7A:
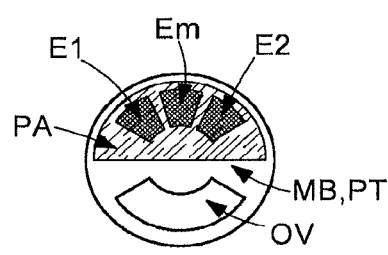
FIG. 7a represents the detection device of FIG. 1, and the rotary wheel back in the initial angular position after a complete rotation of said wheel.
Figure 7B:
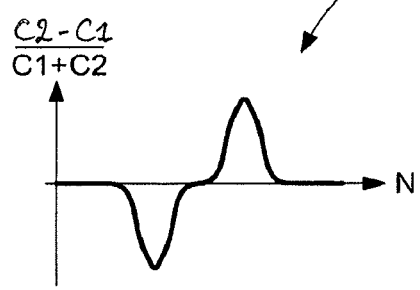

Then, as represented in FIG. 6b, between the position of FIG. 5a and the position of FIG. 6a, the values taken by curve CB diminish and return to a zero value. Finally, until wheel MB returns to its initial angular position, curve CB has a zero value.

Utilising curve CB, two characteristic positions of wheel MB are then calculated. In the first, which corresponds to the position of FIG. 3a, curve CB exhibits a minimum; in the second, which corresponds to the position of FIG. 5a, curve CB exhibits a maximum. Given that the number of steps to achieve the position corresponding to the minimum and the position corresponding to the maximum can be determined from curve CB, it is easy to deduce therefrom the initial position of wheel MB.

Configurations of electrodes E1, E2, Em on plate PA and/or of aperture OV on plate PT, different than those presented with reference to FIG. 1, are possible.

Figure 8:
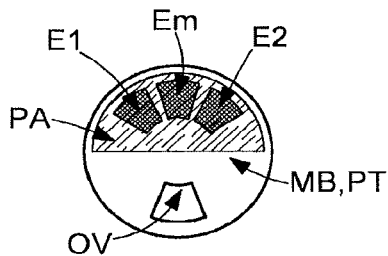
FIG. 8 represents one such device according to a second embodiment of the invention.

In the configuration of FIG. 8, electrodes E1, E2, Em are similar to those of FIG. 1, but aperture OV only extends over 80 degrees (naturally this angular aperture is not limiting). There is therefore no angular position of wheel MB in which the three electrodes are all opposite aperture OV. This configuration avoids the step, observed in FIG. 7b, between the peak corresponding to the maximum and the trough corresponding to the minimum.

Figure 9:
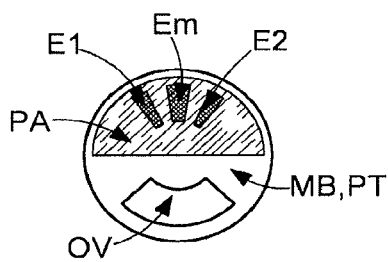
FIG. 9 represents one such device according to a third embodiment of the invention.

In the configuration of FIG. 9, the three electrodes E1, E2, Em do not have identical surface areas: first electrode E1 and second electrode E2 have the same surface area, but common electrode Em has a larger surface area. In the embodiment illustrated in FIG. 9, first electrode E1 and second electrode E2 extend over 10 degrees, whereas common electrode Em extends over 18 degrees (naturally, these angular features are not limiting). However, aperture OV extends over 120 degrees: the surface area of aperture OV is thus considerably greater than the sum of the surface areas of electrodes E1, E2, Em.

Figure 10:
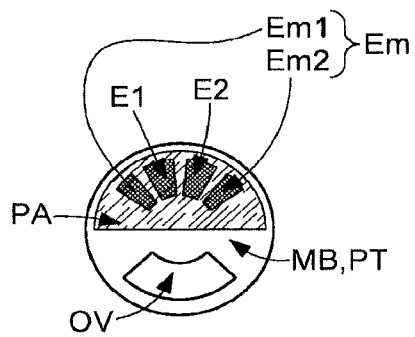
FIG. 10 represents one such device according to a fourth embodiment of the invention.

In the configuration of FIG. 10, first electrode E1 and second electrode E2 are side-by-side, and common electrode Em is formed of two electrically connected half electrodes (the connection is not represented). The half electrodes are placed on either side of the assembly formed by first electrode E1 and second electrode E2. It is noted that, alternatively, the two half electrodes could be placed between first electrode E1 and second electrode E2.

Figure 11:
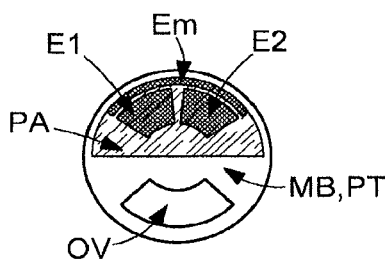
FIG. 11 represents one such device according to a fifth embodiment of the invention.

In the configuration of FIG. 11, first electrode E1 and second electrode E2 are side-by-side, and common electrode Em is arranged along the external portion of electrodes E1 and E2. Further, the total surface area of first electrode E1 and second electrode E2 is substantially equal to the surface area of aperture OV. There is therefore no angular position in which common electrode Em is opposite aperture OV. This configuration allows the surface areas of first electrode E1 and second electrode E2 to be increased, and therefore the amplitude of the peak and trough of measurement curve CB. Further, this configuration avoids the step, observed in FIG. 7*b*, between the peak corresponding to the maximum and the trough corresponding to the minimum.

Of course, the present invention is not limited to the illustrated examples but is capable of various variants and modifications that will appear to those skilled in the art. For example, wheel MB could be pierced with K apertures OV, and plate PA could include K sets of three electrodes like those presented above. This would make it possible to obtain greater in absolute value peak and trough amplitudes of the measurement curve.

What is claimed is:

1. A timepiece, comprising:
a timepiece movement provided with an analogue display and with at least one wheel rotating integrally with a rotary indicator of said analogue display, said at least one wheel including an electrically conductive plate extending substantially orthogonally to the axis of rotation of the at least one wheel, and pierced with at least one aperture; and
a device for detection of a reference angular position of the aperture, the detection device including at least one set of planar electrodes comprising a first electrode, a second electrode, and a common electrode arranged in a plane parallel to the at least one wheel, the common electrode being arranged along portions of the first electrode and of the second electrode,
the aperture being at least partially above or below:
the first electrode in a position called the first position of disequilibrium,
the first electrode and the second electrode in a position called the position of equilibrium, and
the second electrode in a position called the second position of disequilibrium,
wherein, when the rotary indicator starts a rotation from an initial angular position prior to reaching the first position of disequilibrium, the detection device is configured to:
detect a difference between an electrical capacitance of a first capacitor made by the first electrode and the common electrode when the aperture is in the first position of disequilibrium and an electrical capacitance of a second capacitor made by the second electrode and the common electrode when the aperture is in the second position of disequilibrium,
detect a maximum and a minimum of the difference on a curve representing the difference; and
determine the initial angular position of the at least one wheel, by the detected maximum and the minimum of the difference, and
wherein the aperture of the rotary indicator is sized to be directly above an entire surface area of all three of the electrodes simultaneously.

2. The timepiece according to claim 1, wherein all three of the electrodes have a substantially identical area.

3. The timepiece according to claim 2, wherein the aperture is at least partially above or below the common electrode in the first position of disequilibrium, the position of equilibrium and the second position of disequilibrium.

4. The timepiece according to claim 3, wherein the three electrodes are completely above or below the aperture in the second position.

5. The timepiece according to claim 1, wherein the common electrode includes two planar half electrodes electrically connected to each other, the half electrodes being arranged on either side of an assembly formed by the first electrode and the second electrode.

6. The timepiece according to claim 1, wherein the first electrode and the second electrode are placed side-by-side, and the common electrode extends substantially in the shape of an annular portion along the first electrode and the second electrode.

7. A method for determination of an angular position of the at least one wheel of the timepiece movement of the timepiece according to claim 1, including:
performing a stepwise rotation of said at least one wheel from the initial angular position;
measuring, simultaneously with the rotation, $$\frac{C2 - C1}{C1 + C2}$$

as a function of the stepwise rotation, where C1 is the electrical capacitance of the first capacitor formed by the first electrode and the common electrode, and C2 is the electrical capacitance of the second capacitor formed by the second electrode and the common electrode;
detecting the maximum and the minimum on the curve representing the measuring; and
determining the initial angular position of the at least one wheel, by the detected maximum and minimum on the curve.

8. The timepiece according to claim 1, wherein the detection device is configured to determine a number of steps between the first position and the second position and to calculate the initial angular position of the at least one wheel from the determined number of steps.

9. The method according to claim 7, wherein the determining includes determining a number of steps between the first position and the second position and calculating the initial angular position of the at least one wheel from the determined number of steps.

* * * * *